(12) United States Patent
Kondo

(10) Patent No.: US 12,376,276 B2
(45) Date of Patent: Jul. 29, 2025

(54) FIDUCIAL MARK ALLOCATION METHOD, FIDUCIAL MARK ALLOCATION DEVICE, MOUNTING METHOD AND MOUNTING SYSTEM

(71) Applicant: FUJI CORPORATION, Chiryu (JP)

(72) Inventor: Daigo Kondo, Toyota (JP)

(73) Assignee: FUJI CORPORATION, Chiryu (JP)

( * ) Notice: Subject to any disclaimer, the term of this patent is extended or adjusted under 35 U.S.C. 154(b) by 882 days.

(21) Appl. No.: 17/607,556

(22) PCT Filed: May 28, 2019

(86) PCT No.: PCT/JP2019/021063
§ 371 (c)(1),
(2) Date: Oct. 29, 2021

(87) PCT Pub. No.: WO2020/240688
PCT Pub. Date: Dec. 3, 2020

(65) Prior Publication Data
US 2022/0210910 A1    Jun. 30, 2022

(51) Int. Cl.
*H05K 13/08* (2006.01)
*H05K 1/02* (2006.01)

(52) U.S. Cl.
CPC ....... *H05K 13/0812* (2018.08); *H05K 1/0269* (2013.01); *H05K 2201/09918* (2013.01)

(58) Field of Classification Search
CPC ............... H05K 13/08; H05K 13/0812; H05K 13/0815; H05K 13/089; H05K 2201/09918
See application file for complete search history.

(56) References Cited

U.S. PATENT DOCUMENTS 6,374,484 B1    4/2002  Yoshida et al.
2008/0250636 A1*  10/2008  Okuda ............... H05K 13/0812
                                                                    29/742

FOREIGN PATENT DOCUMENTS

JP    2018152400 A  *  9/2018
WO  WO 2014/076804 A1    5/2014

OTHER PUBLICATIONS

International Search Report mailed on Jul. 23, 2019 in PCT/JP2019/021063 filed on May 28, 2019 (2 pages).

* cited by examiner

*Primary Examiner* — Livius R. Cazan
(74) *Attorney, Agent, or Firm* — Oblon, McClelland, Maier & Neustadt, L.L.P.

(57) ABSTRACT

A fiducial mark allocation method including: allocating at least two fiducial marks out of three or more fiducial marks provided on a board to a component to be used for calculating a correction amount of a mounting position of the component on the board; determining whether the mounting position of the component is within a range defined by the fiducial marks in an X direction, a Y direction, or both the X direction and the Y direction, wherein the allocating of the at least two fiducial marks is performed based on whether the mounting position of the component is within a range defined by the fiducial marks in the X direction, the Y direction, or both the X direction and the Y direction.

18 Claims, 6 Drawing Sheets

[Fig. 1]
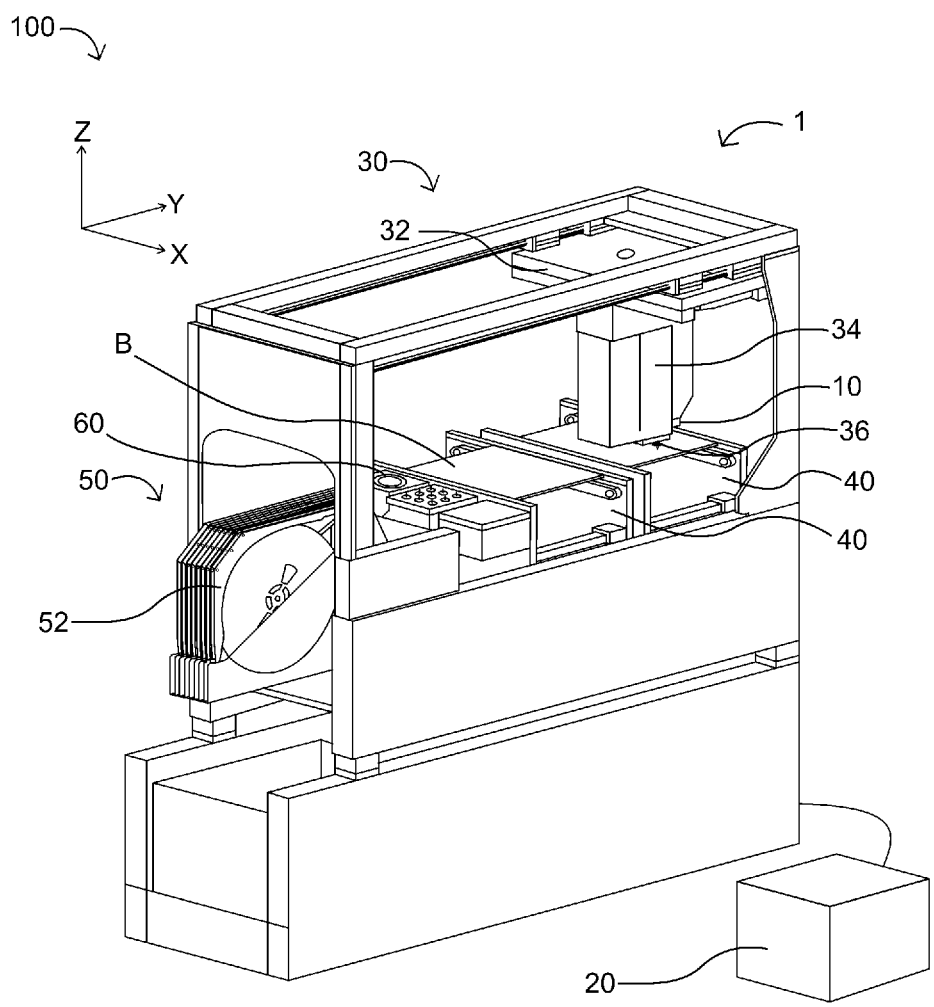

[Fig. 2]
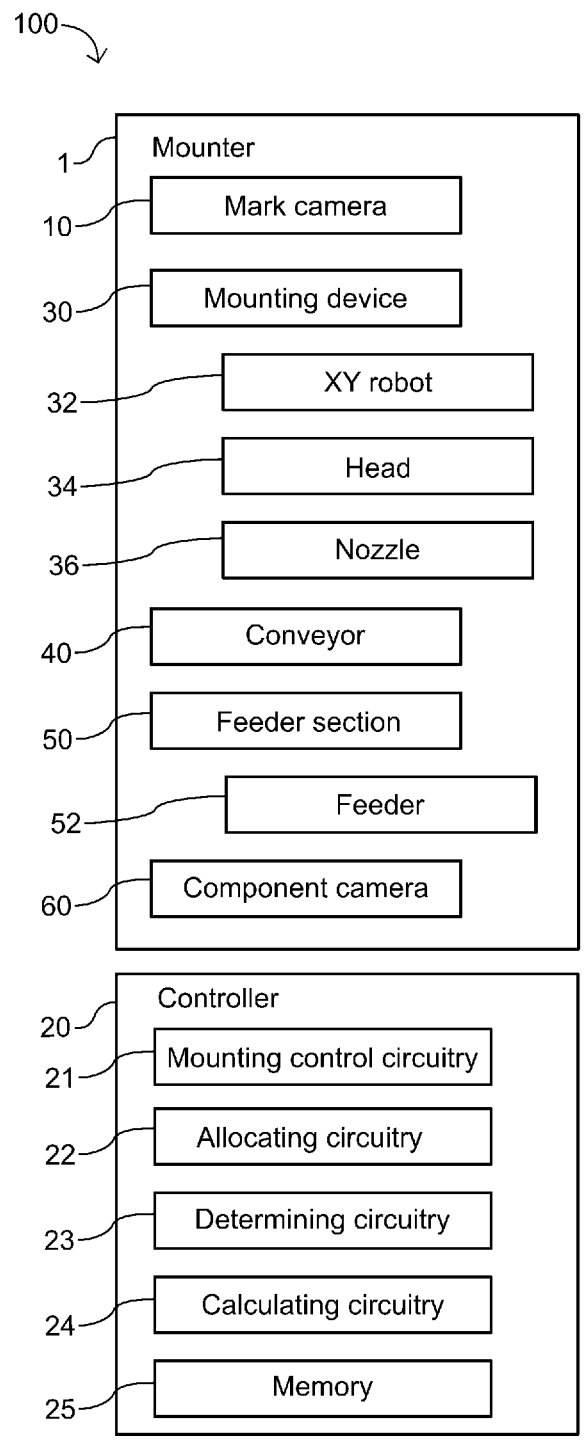

[Fig. 3]
| Mounting order | Component name | Feeder slot | Mounting position X | Mounting position Y | Mark 1 | Mark 2 | Mark 3 |
|---|---|---|---|---|---|---|---|
| 1 | A1 | 10 | ... | ... | ... | ... | ... |
| 2 | ... | ... | ... | ... | ... | ... | ... |
| 3 | ... | ... | ... | ... | ... | ... | ... |
| 4 | ... | ... | ... | ... | ... | ... | ... |
| 5 | ... | ... | ... | ... | ... | ... | ... |
[Fig. 4]
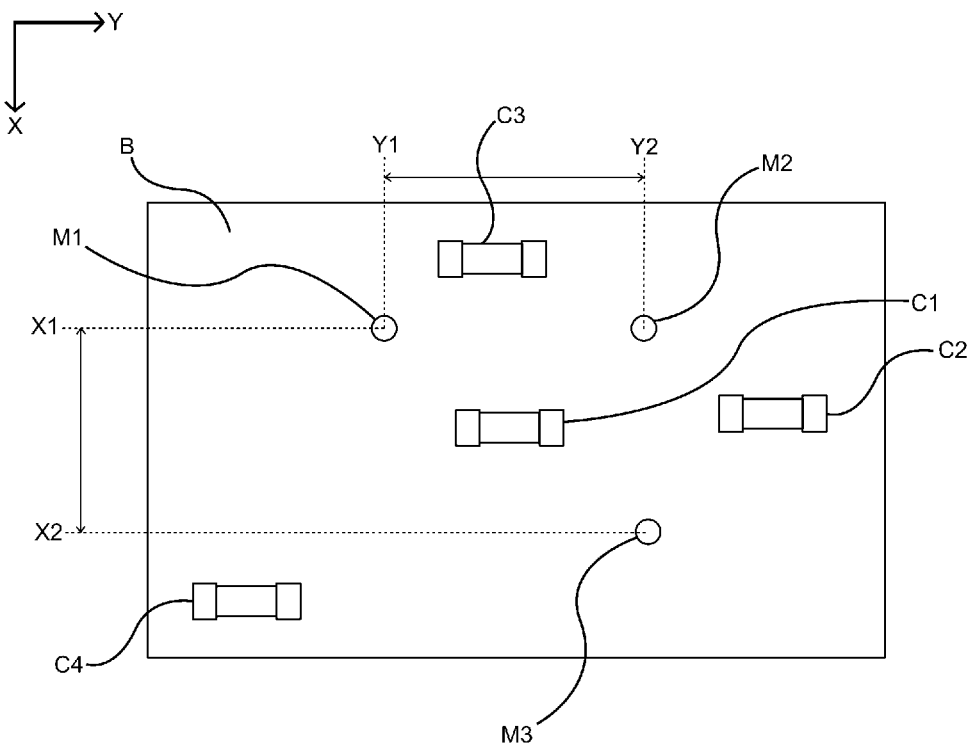

[Fig. 5]
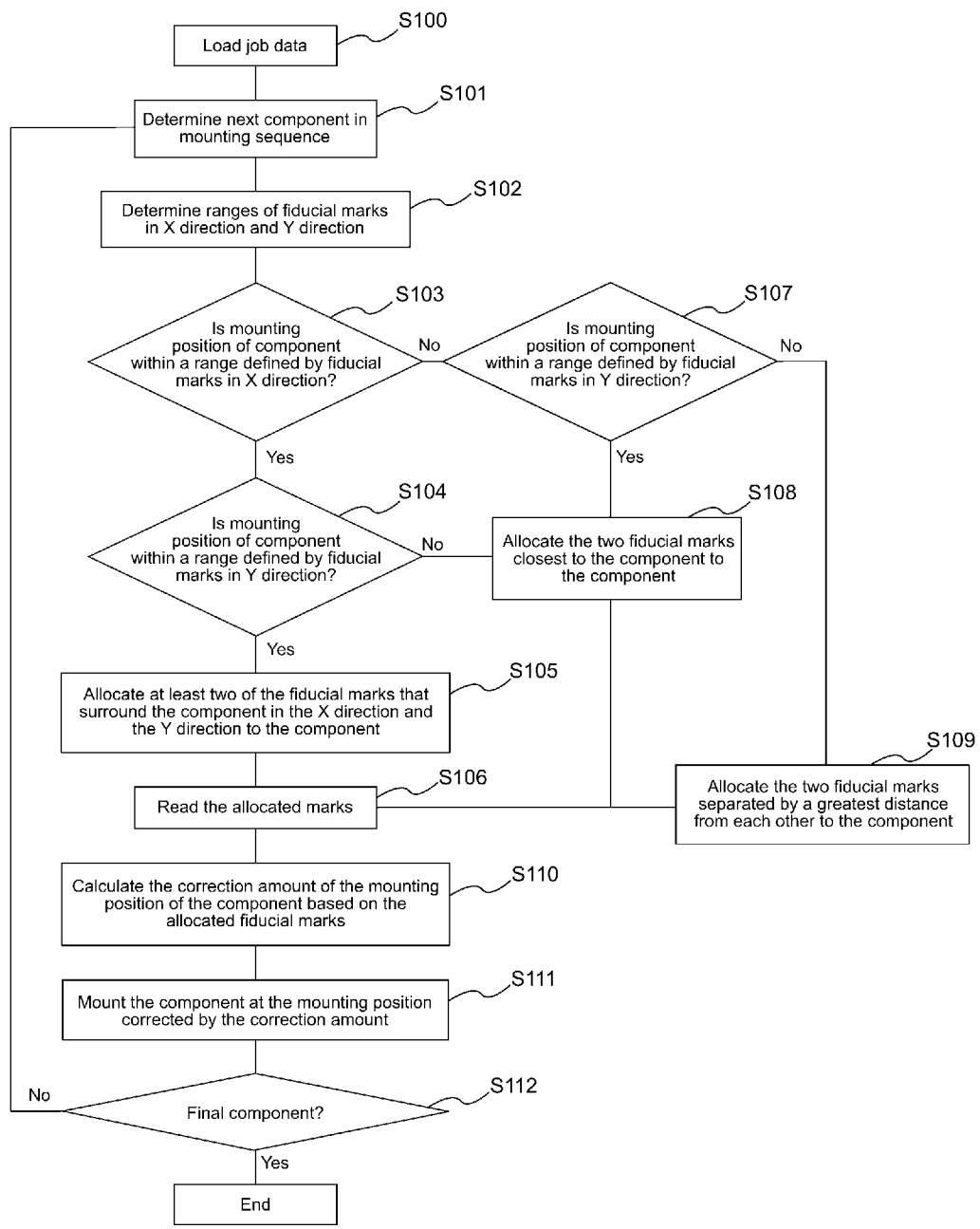

[Fig. 6]
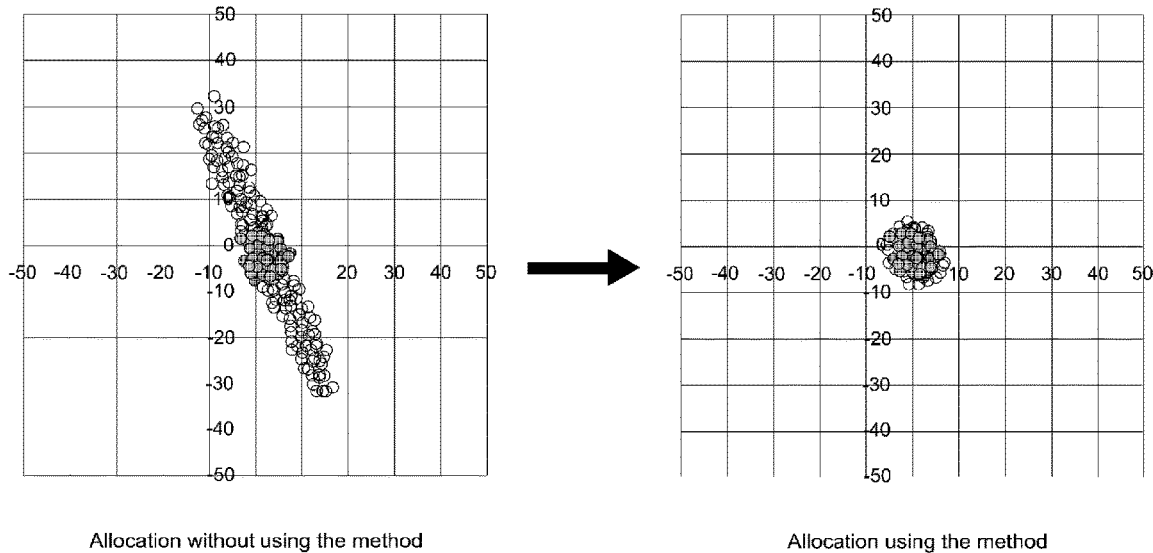
Allocation without using the method          Allocation using the method
[Fig. 7]
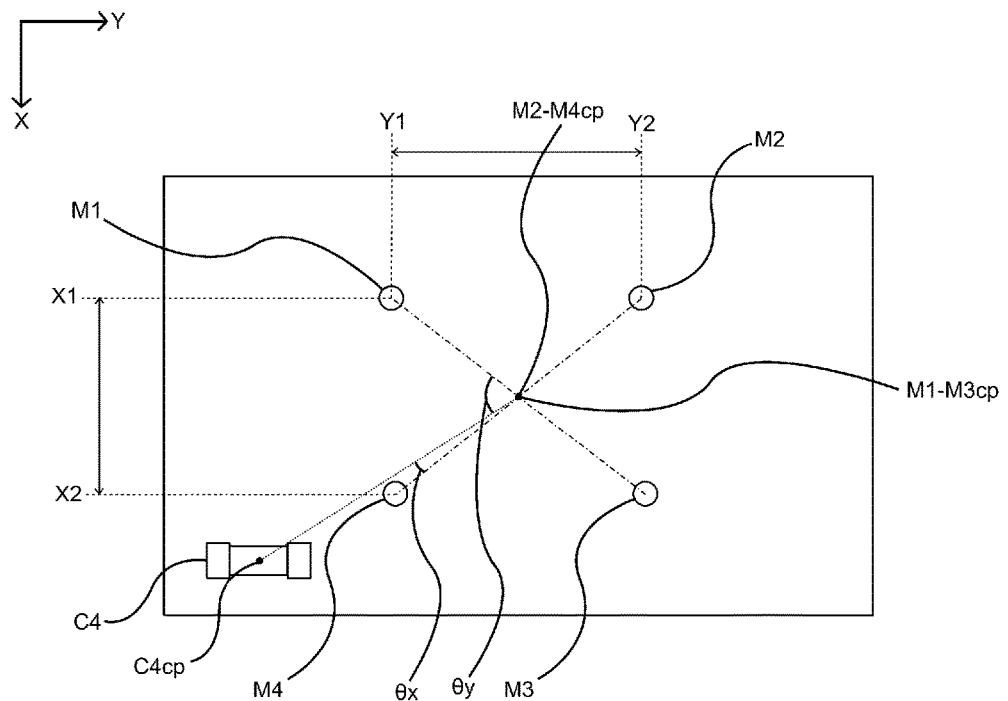

[Fig. 8]
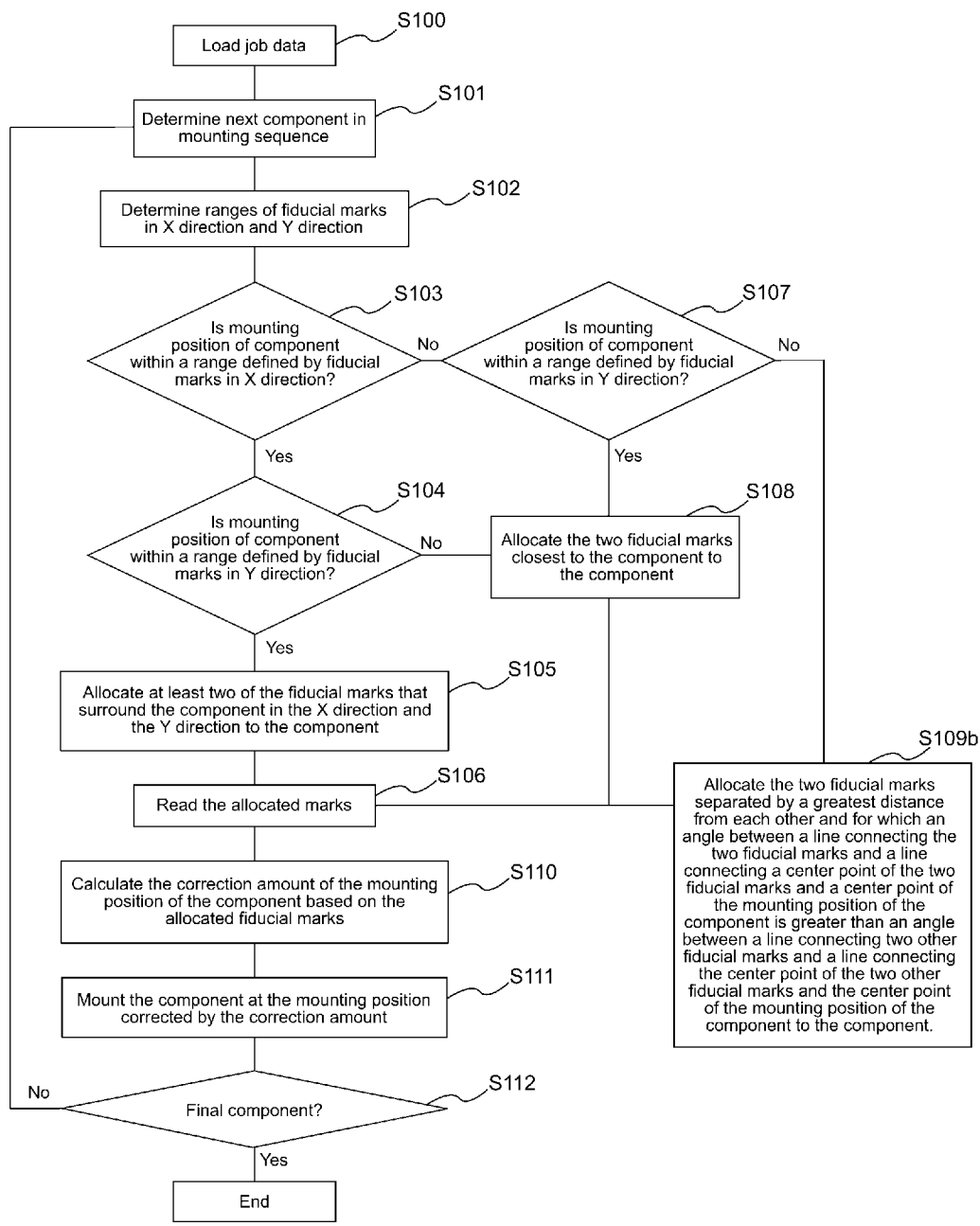

FIDUCIAL MARK ALLOCATION METHOD, FIDUCIAL MARK ALLOCATION DEVICE, MOUNTING METHOD AND MOUNTING SYSTEM

TECHNICAL FIELD

The present application relates to a fiducial mark allocation method for allocating fiducial marks to be used for correcting a mounting position of a component on a board, and to a fiducial mark allocation device, a mounting method, and a mounting system that perform the fiducial mark allocation method.

BACKGROUND ART

Fiducial marks are used as positional references in a manufacturing process in which an item is mounted onto a board such as a circuit board, a carrier, or a substrate. For example, in electronics manufacturing, fiducial marks (also referred to as "marks") are provided at given locations on a circuit board (also referred to as "board"). Positions of the marks are measured by, for example, a component mounter (also referred to as "mounter") and are used to correct the mounting position of components that are to be mounted on the board. A single fiducial mark can be used to correct shift (difference between the expected position of the board based on design data and the actual position of the board as measured) in only the X and Y directions. Two or more fiducial marks can be used to correct shift in the X and Y directions, rotation, and stretch in a single direction. Three or more fiducial marks can be used to correct shift in the X and Y directions, rotation, and non-linear distortions (such as scaling, stretching, or twisting) in the X and Y directions.

Often boards are designed with global fiducial marks provided near the edges of the board at positions closer to an edge than any of the mounting positions of the components. Here, the mounting positions may be the lands of a circuit on which components are mounted. (Note that, components are usually mounted on lands via a conductive material, for example, solder paste.) Some boards are also provided with local fiducial marks close to the mounting position of a specific component for which high mounting accuracy is required.

Reading fiducial marks takes time, so it is desirable to perform reading of as few marks as possible. Accurate correction of mounting positions can generally be achieved by using global fiducial marks for any of the components that lie inside a range of those global fiducial marks. Thus, when creating a production program (job) for a mounter, for example, conventionally the global fiducial marks are allocated automatically to each of the components to be mounted on the board such that the measured position of the marks can be used for correction of the respective mounting positions of the components. Here, allocation refers to specifying which fiducial marks are to be measured and used for correction for which components.

When particularly high accuracy is required for a specific component, a single local fiducial mark or multiple local fiducial marks provided near the mounting position of the component may be additionally allocated to correct the mounting position of that specific component. If using a single local fiducial mark, it is desirable for the mark to be at the center of the desired mounting position. If using multiple local fiducial marks, the marks should surround the component. For example, if using two local fiducial marks, one each should be positioned just outside opposite corners of the component in its mounted position.

Examples of devices and methods employing the above are disclosed in Published Patent Application WO 2014076804 A1 ("WO '804") and U.S. Pat. No. 6,374,484 B2 ("U.S. '484").

WO '804 discloses a reference-mark reading method in which multiple fiducial marks printed on a circuit substrate (board) are read. The method includes determining a sequence in which components are to be installed, determining the fiducial marks to be referenced when mounting the components, determining a validated time period for the fiducial marks, and selectively reading the fiducial marks based on the validated time period. An example of production job data with the mounting order and fiducial marks to be referenced is shown in FIG. 4 of WO '804. The selective reading of the fiducial marks means that the marks are read at an appropriate timing. However, WO '804 does not provide details about how to allocate fiducial marks to each component. It is assumed that appropriate fiducial marks are allocated based on fiducial marks that surround the respective components.

U.S. '484 discloses a control device and a circuit board moving device controlled by the control device. The circuit board moving device moves the circuit board closest to a recognition device after moving the component mount position closest to a component feed position. In this state, a fiducial mark on the circuit board is detected, thereby recognizing a position of the circuit board. Examples of production job data with mounting positions, feeding positions, and mark positions order are shown in FIGS. 4 to 6 of U.S. '484. Moving the circuit board close to a recognition device saves time when reading marks. However, U.S. '484 also does not provide details about how to allocate fiducial marks to each component.

CITATION LIST

Patent Literature

PTL 1

Published Patent Application WO 2014076804 A1

PTL 2

U.S. Pat. No. 6,374,484 B2

BRIEF SUMMARY

Technical Problem

In the above patent literature little attention is paid to the allocation of fiducial marks because it is assumed that marks are provided at positions closer to the edge of the board than the mounting positions. However, restraints on circuit board design due to factors such as limited surface area and the use of multi-pattern boards (circuit boards with multiple instances of the same circuit pattern that are mounted with components and then divided during a later stage of production) mean that, in many cases, suitable global fiducial marks that surround all the components are not provided. Local fiducial marks provided for specific components may be available, but the local marks are designed to improve accuracy for a specific component, and it is difficult for a user to determine which fiducial marks should be allocated to other components to achieve accurate and efficient mounting. From the above, we can see that it is desirable to have an efficient and reliable method and device to allocate fiducial marks in order to achieve efficient and accurate mounting.

Solution to Problem

For this, the inventors propose a fiducial mark allocation method including:
allocating at least two fiducial marks out of three or more fiducial marks provided on a board to a component to be used for calculating a correction amount of a mounting position of the component on the board;
determining whether the mounting position of the component is within a range defined by the fiducial marks in an X direction, a Y direction, or both the X direction and the Y direction
wherein
the allocating of the at least two fiducial marks is performed based on whether the mounting position of the component is within a range defined by the fiducial marks in the X direction, the Y direction, or both the X direction and the Y direction.

For performing the above method, the inventors also propose a fiducial mark allocation device including:
allocating circuitry configured to allocate at least two fiducial marks out of three or more fiducial marks provided on a board to a component to be used for calculating a correction amount of a mounting position of the component on the board;
determining circuitry configured to determine whether the mounting position of the component is within a range defined by the fiducial marks in an X direction, a Y direction, or both the X direction and the Y direction
wherein
the allocating circuitry is configured to allocate the at least two fiducial marks based on whether the mounting position of the component is within a range defined by the fiducial marks in the X direction, the Y direction, or both the X direction and the Y direction.

Further, the inventors also propose a mounting method including:
reading at least three fiducial marks on a board;
allocating at least two of the fiducial marks to a component to be used for calculating a correction amount of a mounting position of the component on the board;
determining whether the mounting position of the component is within a range defined by the fiducial marks in an X direction, a Y direction, or both the X direction and the Y direction
calculating the correction amount of the mounting position of the component based on the allocated fiducial marks; and
mounting the component at the mounting position corrected by the correction amount,
wherein
the allocating of the at least two fiducial marks is performed based on whether the mounting position of the component is within a range defined by the fiducial marks in the X direction, the Y direction, or both the X direction and the Y direction.

Further, the inventors also propose a mounting system including:
a conveyor configured to convey a board;
an imaging device configured to read at least three fiducial marks on the board;
allocation control circuitry configured to allocate at least two of the fiducial marks to a component to be used for calculating a correction amount of a mounting position of the component on the board;
determining circuitry configured to determine whether the mounting position of the component is within a range defined by the fiducial marks in an X direction, a Y direction, or both the X direction and the Y direction
calculation control circuitry configured to calculate the correction amount of the mounting position of the component based on the allocated fiducial marks;
a mounting device configured to mount the component at the mounting position corrected by the correction amount; and
wherein
the allocation control circuitry is configured to allocate the at least two fiducial marks based on whether the mounting position of the component is within the range defined by the fiducial marks in the X direction, the Y direction, or both the X direction and the Y direction.

Advantageous Effects

According to a fiducial mark allocation method, a fiducial mark allocation device, a mounting method, and a mounting system above, when allocating at least two fiducial marks out of three or more fiducial marks provided on a board to a component to be used for calculating a correction amount of a mounting position of the component on the board, it is determined whether the mounting position of the component is within a range defined by the fiducial marks in an X direction, a Y direction, or both the X direction and the Y direction, and the allocating of the at least two fiducial marks is performed based on whether the mounting position of the component is within a range defined by the fiducial marks in an X direction, a Y direction, or both the X direction and the Y direction. This enables suitable fiducial marks to be allocated to each component, allowing for efficient and accurate mounting even in cases in which deciding the allocation of fiducial marks is difficult.

BRIEF DESCRIPTION OF DRAWINGS

FIG. 1 is an overall view of a mounting system including a mounter and a controller, according to certain aspects of the disclosure.

FIG. 2 is a block diagram showing the overall configuration of the mounting system, according to certain aspects of the disclosure.

FIG. 3 shows an example of production program (job) data, according to certain aspects of the disclosure.

FIG. 4 shows an example of a board provided with fiducial marks and components mounted on the board, according to certain aspects of the disclosure.

FIG. 5 is a flowchart showing an example of mounting processing, according to certain aspects of the disclosure.

FIG. 6 shows examples of improved mounting accuracy to due allocating suitable fiducial marks to each component for mounting position correction, according to certain aspects of the disclosure.

FIG. 7 shows an example of a board provided with fiducial marks and components mounted on the board, according to certain aspects of the disclosure.

FIG. 8 is a flowchart showing an example of mounting processing, according to certain aspects of the disclosure.

DESCRIPTION OF EMBODIMENTS

Materials, methods, and examples discussed herein are illustrative only and are not intended to be limiting. In the drawings, like reference numerals designate identical or corresponding parts throughout the several views. Further, as used herein, the words "a", "an", and the like include a meaning of "one or more", unless stated otherwise. The drawings are generally drawn not to scale unless specified otherwise.

FIG. 1 is an overall view of mounting system 100, which is an example of a mounting system that mounts components on circuit board B and allocates fiducial marks using a method of the present disclosure. In mounting system 100, mounter 1 is provided with conveyors 40 (conveying means), component supply section 50, mounting device 30 (mounting means), XY robot 32, mounting head 34, suction nozzle 36, component camera 70, mark camera 10 (imaging device or means), and controller 20. As shown in FIG. 1, the widthwise direction of mounter 1 is the X direction, the depth direction of mounter 1 is the Y direction, and the vertical direction is the Z direction.

Feeders 52 for supplying components to be mounted on board B are loaded on component supply section 50 of mounter 1. Feeders 52 are tape feeders that sequentially feed components stored in tape reels to a pickup position. Other types of component feeders that may be used include, for example, tray feeders, stick feeders, bowl feeders, radial feeders, axial feeders, and loose component (bulk) feeders.

Mounting device 30 includes XY-robot 32 that moves mounting head 34 in the X and Y directions. Mounting head 34 is provided with suction nozzle 36. Suction nozzle 36 is attached to mounting head 34 to be capable of being lowered and raised in the Z direction. Mounting head 34 may be provided with multiple suction nozzles 36. Also, instead of a suction nozzle, another type of component handling tool may be used, such a mechanical chuck.

Component camera 60 is provided in mounter 1 between component supply section 50 and conveyors 40. Component camera 60 faces upwards and is capable of imaging components held by suction nozzle 36, marks on mounting head 34, and the like.

Mark camera 10 is attached to XY-robot 32 to move together with mounting head 34. Mark camera 10 faces down and is capable of capturing images of fiducial marks on board B, components at the pickup position, identification marks (such as marks on a nozzle stocker, not shown), other features inside mounter 1 and on board B, and the like.

FIG. 2 is a block diagram showing the overall configuration of mounting system 100. Controller 20 is a computer configured from mounting control circuitry 21 (mounting means), allocating circuitry 22 (allocating means), determining circuitry 23 (determining means), calculating circuitry 24 (calculating means), and memory 25. Controller 20 may be configured as a computer with a CPU, hard disk, ROM, RAM, input-output interface, and the like.

In the figures, controller 20 is shown as a standalone computer separate to mounter 1, but a portion or all of the functional sections of controller 20 may be included inside mounter 1. Alternatively, functional sections of controller 20 may be divided into separate standalone controllers that are connected to each other. Controller 20 may also control one or more production lines each configured from multiple mounters 1. In FIG. 1, mounting system 100 is configured from mounter 1 and controller 20, but mounting system 100 may include one or more of each of mounter 1 and controller 20.

Based on production program data (job data 70, refer to FIG. 3), mounting control circuitry 21 of controller 20 performs control to move mounting head 34 above the pickup position of a feeder 52 loaded on feeder section 50, lower suction nozzle 36 to pick up a component, raise suction nozzle 36, move mounting head 34 above component camera 60 so that the component can be imaged, move mounting head 34 above board B, and lower suction nozzle 36 to mount the component at a specified mounting position on board B. Details about allocating fiducial marks to the component, reading fiducial marks, and correcting the mounting position of the component are described later.

FIG. 3 shows an example of production program data, job data 70, which is memorized, for example, in memory 25 of controller 20. Job data 70 includes, for example, a mounting order in which components are to be mounted on board B, component names, feeder slots at which components are loaded for supply, coordinates specifying mounting positions X and Y on board B, coordinates specifying the position of multiple fiducial marks on board B, and which fiducial marks are allocated to which components (that is, which fiducial are specified to be measured and used for correction for that component).

FIG. 4 shows an example of a board B provided with fiducial marks and components mounted on the board B. The components C1 to C4 are shown on the board positioned as if mounted at their respective mounting positions according to the design data of the board. There are three fiducial marks on the board B, M1 to M3. A range defined by the fiducial marks M1 to M3 in the X direction is the range X1 to X2, which is the distance between the two fiducial marks separated by the greatest distance in the X direction. A range defined by the fiducial marks M1 to M4 in the Y direction is the range Y1 to Y2, which is the distance between the two fiducial marks separated by the greatest distance in the Y direction. Details of how fiducial marks are allocated to each of the components C1 to C4 shown in FIG. 4 are described later.

FIG. 5 is a flowchart showing an example of mounting processing that includes a fiducial mark allocation method, according to certain aspects of the disclosure. First, in S100, controller 20 loads job data 70 and stores job data 70 in memory 25. Then, in S101, based on job data 70, determining circuitry 23 determines the next component in the mounting sequence. In S102, based on job data 70, determining circuitry 23 determines ranges defined by the fiducial marks in the X direction and the Y direction. Then, in S103, determining circuitry 23 determines whether the mounting position of the component is within a range defined by the fiducial marks in the X direction.

If it is determined in S103 that the mounting position of the component is within the range defined by the fiducial marks in the X direction, processing proceeds to S104 and determining circuitry 23 determines whether the mounting position of the component is within the range defined by the fiducial marks in the Y direction.

Then, if it is determined in S104 that the mounting position of the component is within the range defined by the fiducial marks in the Y direction, in S105, at least two of the fiducial marks that surround the component in the X direction and the Y direction are allocated to the component by allocating circuitry 22.

Next, in S106, the positions of the allocated marks are read. This is performed by controller 20 controlling mounting device 30 and mark camera 10 such that mark camera 10 is moved above the board to enable mark camera 10 to capture images of the fiducial marks.

In S110, calculating circuitry 24 calculates a correction amount of the mounting position of the component based on the allocated fiducial marks that were read by mark camera 10. Note that, the positions of fiducial marks in images captured by mark camera 10 may be recognized by well-known image processing methods. Calculations of a correction amount may also be performed by well-known calculation methods.

Next, in S111, mounting control circuitry 21 controls mounting device 30 to move mounting head 34 above the pickup position of a feeder 52 loaded on feeder section 50, lower suction nozzle 36 to pick up the component, raise suction nozzle 36, move mounting head 34 above component camera 60 so that the component can be imaged, move mounting head 34 above board B to the mounting position corrected by the correction amount, and lower suction nozzle 36 to mount the component at the corrected mounting position on board B.

Next, in S112, determining circuitry 23 determines whether the component is the final component in the mounting order. If the component is the final component, processing ends. If the component is not the final component, processing returns to S101.

Returning to S103, if it is determined in S103 that the mounting position of the component is not within a range defined by the fiducial marks in the X direction (S103: no), processing proceeds to S107. In S107, determining circuitry 23 determines whether the mounting position of the component is within the range defined by the fiducial marks in the Y direction.

In S107, if it is determined that the mounting position of the component is within the range defined by the fiducial marks in the Y direction, in S108, allocating circuitry 22 allocates the two fiducial marks closest to the component to the component as the fiducial marks to be used for calculating the correction amount of the mounting position of the component. Processing then proceeds to S106 (see description above).

Similar to a case in which "no" is determined in S103 and "yes" is determined in S107, in a case in which "yes" is determined in S103 and "no" is determined in S104, in S108, allocating circuitry 22 allocates the two fiducial marks closest to the component as the fiducial marks to be used for calculating the correction amount of the mounting position of the component. Processing then proceeds to S106 (see description above).

Conversely, in S107, if it is determined that the mounting position of the component is not within the range defined by the fiducial marks in the Y direction (S107: no), processing proceeds to S109. In S109, allocating circuitry 22 allocates the two fiducial marks separated by a greatest distance from each other to the component as the fiducial marks to be used for calculating the correction amount of the mounting position of the component. Processing then proceeds to S106 (see description above).

Based on the above flowchart, allocating of fiducial marks and mounting of components C1 to C4 as shown in FIG. 4 will now be described. For component C1, the mounting position is within the range defined by the fiducial marks in the X direction (X1 to X2) and is within the range defined by the fiducial marks in the Y direction (Y1 to Y2). Therefore, "yes" is determined in S103 and S104, and at least two of the fiducial marks that surround the component in the X direction and the Y direction are allocated to the component. For example, all of the fiducial marks, that is, M1 to M3, are allocated to component C1.

For component C2, the mounting position is within the range defined by the fiducial marks in the X direction (X1 to X2) but is not within the range defined by the fiducial marks in the Y direction (Y1 to Y2). That is, "yes" is determined in S103 and "no" is determined in S104. Thus, in S108, the two fiducial marks closest to the component, that is, M2 and M3, are allocated to component C2.

For component C3, the mounting position is not within the range defined by the fiducial marks in the X direction (X1 to X2) but is within the range defined by the fiducial marks in the Y direction (Y1 to Y2). That is, "no" is determined in S103 and "yes" is determined in S107. Thus, in S108, the two fiducial marks closest to the component, that is, M1 and M2, are allocated to component C3.

For component C4, the mounting position is not within the range defined by the fiducial marks in the X direction (X1 to X2) and is not within the range defined by the fiducial marks in the Y direction (Y1 to Y2). That is, "no" is determined in S103 and "no" is determined in S107. Thus, in S109, the two fiducial marks separated by a greatest distance from each other, that is, M1 and M3, are allocated to component C4.

In this manner, fiducial marks are allocated to each of the components C1 to C4 in an efficient and reliable manner, and efficient and accurate mounting is achieved. Further, even in a case in which it is difficult for an operator to determine which fiducial marks to allocate to a component, suitable fiducial marks are allocated to the component in an easy manner.

FIG. 6 shows an example of improved mounting accuracy to due allocating suitable fiducial marks to each component for mounting position correction. Each dot represents one component after being mounted on a board, with the deviation from the desired position (the design position) being the distance from the (0, 0) point on the graph (typically, a component mounter mounts component with an accuracy from +/−5 to +/−50 microns).

In FIG. 6, the grey dots represent a component, such as C1 in FIG. 1, with a mounting position within the range defined by the fiducial marks in the X direction and within the range defined by the fiducial marks in the Y direction. The white dots represent components, such as components C2 to C4 in FIG. 4, with a mounting position not within the range defined by the fiducial marks in the X direction, or not within the range defined by the fiducial marks in the Y direction, or both. The graph on the left shows mounting accuracy for allocation without using a method of this disclosure; the graph on the right shows mounting accuracy for allocation using a method of this disclosure.

The level of accuracy shown in the graph on the left is achieved when all the fiducial marks, M1 to M3, are allocated to each of the components C1 to C4, regardless of whether the mounting position of the components is within a range defined by the fiducial marks in the X direction and the Y direction. Conversely, the graph on the right shows mounting accuracy when the method described above is used. Here, because the allocating to the components of the at least two fiducial marks is performed based on whether the mounting position of the component is within a range defined by the fiducial marks in the X direction, the Y direction, or both the X direction and the Y direction, mounting accuracy is greatly improved, as well as allocating being easy. Note that, the improved mounting accuracy is due to better accuracy for the components represented by white dots, because it is for these components that the allocated fiducial marks are different when using a method of this disclosure.

In a case in which there are more than one pair of fiducial marks separated by the same greatest distance, allocation may be performed as described below with reference to FIGS. 7 and 8. Here, as shown in FIG. 7, board B is provided with four fiducial marks, M1 to M4. The distance between M1 and M3 and the distance between M2 and M4 are the same (these distances being greater than the distances between other combination of the four fiducial marks). In this case, the fiducial marks are allocated to component C4 (the mounting position of which is not within the range defined by the fiducial marks in the X direction [X1 to X2] and is not within the range defined by the fiducial marks in the Y direction [Y1 to Y2]) based on the angles between a line connecting the fiducial marks and a line connecting a center point of the mounting position of the component and a center point of the line connecting the fiducial marks. Specifically, as shown in FIG. 7, a center point of the mounting position of component C4 is C4$cp$. A center point of a line connecting M1 and M3 is M1-M3$cp$. A center point of a line connecting M2 and M4 is M2-M4$cp$ (in this case, both center points are at the same position). An angle between the line connecting C4$cp$ and M1-M3$cp$ and a line connecting M1 and M3 is θ y. An angle between the line connecting C4$cp$ and M2-M4$cp$ and a line connecting M1 and M3 is θx. θy is greater than θx, so the two fiducial marks M1 and M3 are allocated to component C4.

An example of a flowchart for processing in the above case is shown in FIG. 8. Here, except for S109$b$, which replaces S109 of FIG. 5, processing is the same as that shown in FIG. 5. In S109$b$, the two fiducial marks separated by a greatest distance from each other and for which an angle between a line connecting the two fiducial marks and a line connecting a center point of the two fiducial marks and a center point of the mounting position of the component is greater than an angle between a line connecting two other fiducial marks and a line connecting the center point of the two other fiducial marks and the center point of the mounting position of the component are allocated to the component. That is, as described above with reference to FIG. 7, the two fiducial marks M1 and M3 are allocated to component C4.

In this case too, fiducial marks are allocated to the components in an efficient and reliable manner, and efficient and accurate mounting is achieved. Further, even in a case in which it is difficult for an operator to determine which fiducial marks to allocate to a component, suitable fiducial marks are allocated to the component in an easy manner.

It is clear from descriptions above that a fiducial mark allocation device, a mounting method, and a mounting system that perform a fiducial mark allocation method described above have the same advantages as described for the fiducial mark allocation method itself.

Controller 20 is an example of a mark allocation device that performs the above fiducial mark allocation method, and mounting system 100 is an example of a mounting system that performs the above fiducial mark allocation method.

Note that, embodiments of an object of the present disclosure described above are simply examples. As will be understood by those skilled in the art, an object of the present disclosure may be embodied in other specific forms without departing from the spirit or essential characteristics thereof. Accordingly, the present disclosure is intended to be illustrative, but not limiting of the scope of an object of the present disclosure or of the claims.

Numerous modifications and variations on the present disclosure are possible in light of the above teachings. It is therefore to be understood that within the scope of the appended claims, the disclosure may be practiced otherwise than as specifically described herein.

For example, in an embodiment above, there are three or four fiducial marks provided on board B. However, so long as there are at least three fiducial marks, the quantity is not particular limited. Also, the fiducial marks may be provided at any positions on the board.

Also, in an embodiment above, it is assumed that component mounting positions and fiducial mark positions are based on center positions of the components and the fiducial marks, but component mounting positions may be based on edges or any other recognizable feature of the components and the fiducial marks.

In addition, the types of board B and components C1 to C4 are not particularly limited, so long as the components are mounted on the board using fiducial marks of the board for positional correction. The shapes of the fiducial marks are also not particularly limited and may be, for example, circular, triangular, square, cross-shaped, star-shaped, or irregularly shaped.

Further, the order of the steps in the flowcharts of FIG. 5 and FIG. 8 is not limited to that shown. For example, reading of allocated marks may be performed for all the fiducial marks in advance, with allocation and calculation being performed for each component later. Also, determination of fiducial mark ranges and allocation of fiducial marks may be performed for all components first, and then mounting may be performed based on the respective correction amounts for the mounting position of each component.

INDUSTRIAL APPLICABILITY

This disclosure can be applied to the field of component mounting, specifically in an area of allocating fiducial marks to be used for correcting a mounting position of a component on a board

REFERENCE SIGNS LIST

1: mounter;
10: mark camera;
20: controller;
21: mounting control circuitry;
22: allocating circuitry;
23: determining circuitry;
24: calculating circuitry;
25: memory;
30: mounting device;
32: XY robot;
34: head;
36: nozzle;
40: conveyor;
50: feeder section;
52: feeder;
60: component camera;
70: job data (production program);
B: board;
C1 to C4: component;
M1 to M4: mark (fiducial mark);
θx, θy: angle

The invention claimed is:
1. A mounting system comprising:
a conveyor configured to convey a board;
an imaging device configured to read at least three fiducial marks on the board;
determining circuitry configured to determine whether a mounting position of a component is within a range defined by the at least three fiducial marks on the board in an X direction, a Y direction, or both the X direction and the Y direction allocation control circuitry configured to allocate at least two fiducial marks of the at least three fiducial marks on the board to the component to be used for calculating a correction amount of the mounting position of the component on the board based on whether the mounting position of the component is within the range defined by the at least three fiducial marks in the X direction, the Y direction, or both the X direction and the Y direction;

calculation control circuitry configured to calculate the correction amount of the mounting position of the component based on the allocated at least two fiducial marks; and a mounting device configured to mount the component at the mounting position corrected by the correction amount.

2. The mounting system of claim 1, wherein
if the mounting position of the component is within the range defined by the at least three fiducial marks in the X direction and the Y direction, at least two of the fiducial marks that surround the component in the X direction and the Y direction are allocated to the component by the allocation control circuitry.

3. The mounting system of claim 2, wherein
if the mounting position of the component is within the range defined by the at least three fiducial marks in only the X direction or only the Y direction, out of all the at least three fiducial marks, the two fiducial marks closest to the component are allocated to the component by the allocation control circuitry.

4. The mounting system of claim 2, wherein
if the mounting position of the component is outside the range defined by the at least three fiducial marks in both the X direction and the Y direction, out of all the at least three fiducial marks, the two fiducial marks separated by a greatest distance from each other are allocated to the component by the allocation control circuitry.

5. The mounting system of claim 1, wherein
if the mounting position of the component is within the range defined by the at least three fiducial marks in only the X direction or only the Y direction, out of all the at least three fiducial marks, the two fiducial marks closest to the component are allocated to the component by the allocation control circuitry.

6. The mounting system of claim 3, wherein
if the mounting position of the component is outside the range defined by the at least three fiducial marks in both the X direction and the Y direction, out of all the at least three fiducial marks, the two fiducial marks separated by a greatest distance from each other are allocated to the component by the allocation control circuitry.

7. The mounting system of claim 1, wherein
if the mounting position of the component is outside the range defined by the at least three fiducial marks in both the X direction and the Y direction, out of all the at least three fiducial marks, the two fiducial marks separated by a greatest distance from each other are allocated to the component by the allocation control circuitry.

8. The mounting system of claim 4, wherein
if the mounting position of the component is outside the range defined by the at least three fiducial marks in both the X direction and the Y direction, out of all the at least three fiducial marks, the two fiducial marks separated by a greatest distance from each other are allocated to the component by the allocation control circuitry.

9. The mounting system of claim 1, wherein
if the mounting position of the component is outside the range defined by the at least three fiducial marks in both the X direction and the Y direction, out of all the at least three fiducial marks, the two fiducial marks separated by a greatest distance from each other and for which an angle between a line connecting the two fiducial marks and a line connecting a center point of the two fiducial marks and a center point of the mounting position of the component is greater than an angle between a line connecting two other fiducial marks and a line connecting the center point of the two other fiducial marks and the center point of the mounting position of the component are allocated to the component by the allocation control circuitry.

10. A mounting system comprising:
a conveying means configured to convey a board;
an imaging means configured to read at least three fiducial marks on the board;
a determining means configured to determine whether a mounting position of a component is within a range defined by the at least three fiducial marks in an X direction, a Y direction, or both the X direction and the Y direction;
an allocating means configured to allocate at least two fiducial marks of the at least three fiducial marks to the component to be used for calculating a correction amount of a mounting position of the component on the board based on whether the mounting position of the component is within the range defined by the at least three fiducial marks in the X direction, the Y direction, or both the X direction and the Y direction;
a calculating means configured to calculate the correction amount of the mounting position of the component based on the allocated at least two fiducial marks; and
a mounting means configured to mount the component at the mounting position corrected by the correction amount.

11. The mounting system of claim 10, wherein
if the mounting position of the component is within the range defined by the at least three fiducial marks in the X direction and the Y direction, at least two of the fiducial marks that surround the component in the X direction and the Y direction are allocated to the component by the allocating means.

12. The mounting system of claim 11, wherein
if the mounting position of the component is within the range defined by the at least three fiducial marks in only the X direction or only the Y direction, out of all the at least three fiducial marks, the two fiducial marks closest to the component are allocated to the component by the allocating means.

13. The mounting system of claim 11, wherein
if the mounting position of the component is outside the range defined by the at least three fiducial marks in both the X direction and the Y direction, out of all the at least three fiducial marks, the two fiducial marks separated by a greatest distance from each other are allocated to the component by the allocating means.

14. The mounting system of claim 10, wherein
if the mounting position of the component is within the range defined by the at least three fiducial marks in only the X direction or only the Y direction, out of all the at least three fiducial marks, the two fiducial marks closest to the component are allocated to the component by the allocating means.

15. The mounting system of claim 14, wherein
if the mounting position of the component is outside the range defined by the at least three fiducial marks in both the X direction and the Y direction, out of all the at least three fiducial marks, the two fiducial marks separated by a greatest distance from each other are allocated to the component by the allocating means.

16. The mounting system of claim 10, wherein
if the mounting position of the component is outside the range defined by the at least three fiducial marks in both the X direction and the Y direction, out of all the at least three fiducial marks, the two fiducial marks separated by a greatest distance from each other are allocated to the component by the allocating means.

17. The mounting system of claim 16, wherein
if the mounting position of the component is outside the range defined by the at least three fiducial marks in both the X direction and the Y direction, out of all the at least three fiducial marks, the two fiducial marks separated by a greatest distance from each other are allocated to the component by the allocating means.

18. The mounting system of claim 10, wherein
if the mounting position of the component is outside the range defined by the at least three fiducial marks in both the X direction and the Y direction, out of all the at least three fiducial marks, the two fiducial marks separated by a greatest distance from each other and for which an angle between a line connecting the two fiducial marks and a line connecting a center point of the two fiducial marks and a center point of the mounting position of the component is greater than an angle between a line connecting two other fiducial marks and a line connecting the center point of the two other fiducial marks and the center point of the mounting position of the component are allocated to the component by the allocating means.

\* \* \* \* \*